US007068122B2

(12) United States Patent
Weng et al.

(10) Patent No.: US 7,068,122 B2
(45) Date of Patent: Jun. 27, 2006

(54) MINIATURIZED MULTI-LAYER BALUN

(75) Inventors: Ching-Liang Weng, Taipei (TW); Chang-Sheng Chen, Taipei (TW); Ying-Jiunn Lai, Jiadong Township, Pingtung County (TW); Uei-Ming Jow, Taichung (TW); Chin-Sun Shyu, Jhudong Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/954,107

(22) Filed: Sep. 28, 2004

(65) Prior Publication Data

US 2006/0066415 A1 Mar. 30, 2006

(51) Int. Cl.
*H01P 5/10* (2006.01)
*H03H 7/42* (2006.01)

(52) U.S. Cl. ........................................ 333/26; 333/246

(58) Field of Classification Search .................. 333/25, 333/26

See application file for complete search history.

(56) References Cited

U.S. PATENT DOCUMENTS

| | | | | |
|---|---|---|---|---|
| 5,497,137 | A | 3/1996 | Fujiki | 336/200 |
| 5,886,589 | A * | 3/1999 | Mourant | 333/26 |
| 6,018,277 | A * | 1/2000 | Vaisanen | 333/26 |
| 6,483,415 | B1 | 11/2002 | Tang | 336/200 |
| 6,661,306 | B1 | 12/2003 | Goyette et al. | 333/25 |
| 6,954,116 | B1 * | 10/2005 | Nosaka | 333/26 |

* cited by examiner

*Primary Examiner*—Dean Takaoka

(57) ABSTRACT

A miniaturized multi-layer balun includes a pair of capacitive elements, at least one section of broadside coupled lines connected in series to an unbalanced and two balanced ports through a pair of transmission lines. Each section has first and second coupled lines. A ground connection is located between two central second coupled lines, and connected to a ground. By means of a multi-layer structure and the addition of a ground connection, the balun of the invention can be fabricated with five conductor layers. This not only greatly decreases the size of the balun device, but also enhances the stability of the device. From the measured return loss and differences in magnitude and phase to the frequency response, it shows that the balun of the invention has good impedance match.

9 Claims, 8 Drawing Sheets

MINIATURIZED MULTI-LAYER BALUN

FIELD OF THE INVENTION

The present invention generally relates to a balance-to-unbalance transformer (balun) used in a wireless communication, and more specifically to a miniaturized multi-layer balun.

BACKGROUND OF THE INVENTION

A balance-to-unbalance transformer is one of the most commonly used passive elements in wireless communication systems. A balun is a device for converting signals between an unbalanced circuit structure and a balanced circuit structure. The signal of a balanced circuit structure comprises two signal components, called balanced differential signals, which are with same magnitude but 180-degree phase difference. The transmission of differential signals can be used to reduce the common mode noise interference. Therefore, a balun is usually designed in a part of a radio frequency (RF) transceiver, power amplifier (PA), antenna and mixer circuit.

There are several types of baluns, including lumped-type (lattice type), coil-type and distributed-type baluns. A lumped-type balun uses lumped capacitors and inductors to match impedance and generate two balanced signals with same magnitude and 180-degree phase difference. The advantages of a lumped-type balun are small volume and light weight. However, it is not easy to maintain the 180-degree phase difference and the identical magnitude between the two signals.

Coil-type baluns are widely used in lower frequency and ultra high frequency (UHF) bands. When a coil-type balun is used in higher than the UHF band, it usually has a drawback of having considerable loss. In addition, it has reached the limit of miniaturization and can not be further reduced in size.

Distributed-type baluns can further be classified as 180-degree hybrid and Marchand. A 180-degree hybrid balun has a fairly good frequency response in the microwave frequency band. However, its size often poses a problem when it is used in the radio frequency range between 200 MHz and several GHz. Because a 180-degree hybrid balun comprises a few sections of quarter wave transmission lines, it is difficult to reduce the size. Even if it is manufactured in a meandered way, a significant area is still required. One approach to reducing the size is to use a power divider along with a pair of transmission lines having different length for generating the 180-degree phase difference. Nevertheless, the size is still too large.

U.S. Pat. No. 6,661,306 disclosed a compact lumped element balun having a dual highpass and lowpass layout. As shown in FIG. 1, the balun 100 uses the overlapping lumped elements. Based on the band, the balun can adjust the capacitance and inductance, and use the metal wire and metal electrode on the substrate to obtain a plate and spiral structure having equivalent capacitance and inductance. The advantage of the design is that it uses a plurality of passive elements, and can even form a n circuit. In addition, the balun 100 is integrated with the filtering circuit to form a filter with unbalanced signal on one output end, and balanced signal on the other output end. However, the disadvantage of the design is that it requires a plurality of passive elements, and when a sensitive passive element has a slight deviation from its original design due to the manufacture process, the entire design will exhibit a different characteristics. In addition, the planar design also requires a larger space.

U.S. Pat. No. 6,483,415 disclosed a multi-layer LC resonance balun. As shown in FIG. 2A, the balun 200 uses a capacitor 201 and a plurality of coupled lines 202*a*–202*d* to form an LC structure, which has adjustable capacitor and transmission line on one side. In FIG. 2B, the balun 210 uses two or more capacitors 211–212 and a plurality of coupled lines 213–214 to form an equivalent LC structure. The unbalanced signal from output port is coupled to balanced signal, which is outputted from the balanced output port. The length of the coupling inductor and the area of the capacitor depend on the frequency band. The advantage of the balun is that it uses a stack structure to reduce the overall area of the circuit. The disadvantage of the embodiment in FIG. 2B is that it uses the scheme of half wavelength to obtain the ground equivalent to quarter wavelength to the coupled line center. This scheme restricts the reduction in the length of the coupled lines. In addition, the balun uses 6–8 metal layers; therefore, the effectiveness of the balun is very sensitive to the alignment precision of the multi-layer structure during the manufacturing process.

U.S. Pat. No. 5,497,137 disclosed a balun with a five-layer structure. As show in FIG. 2C, the balun 220 includes a first strip 222, a second strip line 226, and a third strip line 228. The first strip line further consists of a first portion 224*a* and a second portion 224*b,* which are coupled with the second strip line 226, and the third strip line 228, respectively. The disadvantage of the balun 220, as in the other conventional arts is that it uses the half wavelength scheme to obtain the ground equivalent to quarter wavelength to the coupled line center.

SUMMARY OF THE INVENTION

This invention has been made to overcome the aforementioned drawbacks of conventional baluns. The primary object is to provide a miniaturized multi-layer balun having an equivalent circuit with a ground connection and a couple of capacitive elements at the two ends of coupled lines connected to the balance I/O ports. The equivalent circuit comprises a first group of at least one section of coupled lines, a second group of at least one section of coupled lines, first and second transmission lines, a couple of capacitive elements, and a ground connection. By means of the multi-layer structure, the size of the balun is reduced. In addition, the balun can be realized with a smaller number of layers, thereby it has simple manufacturing process, reduced cost, and improved yield rate.

According to this invention, both the capacitive elements and the coupled lines of the baluns have a symmetric structure with respect to a center. In a preferred embodiment of the invention, the sections of coupled lines are connected in series through the two transmission lines, in which the coupled lines on the side connecting to the unbalanced I/O ports are connected through the first transmission line, and the coupled lines on the side connecting to the balanced I/O ports are connected through the second transmission line. The ground connection is defined between the first and second groups of the sections of coupled lines, and on the side connecting to the balanced I/O ports. The ground connection is connected to the ground. Each transmission line has two ends. One end of the first transmission line is connected to the ground, and the other end of of the first transmission is connected to the unbalanced I/O port. Both ends of the second transmission line are connected to the balanced I/O ports.

In practice, the ground connection may be formed by using via holes or the metal of the same layer. The couple of capacitive elements may be implemented with capacitors, vertical coupling electrodes, or horizontal coupled lines.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
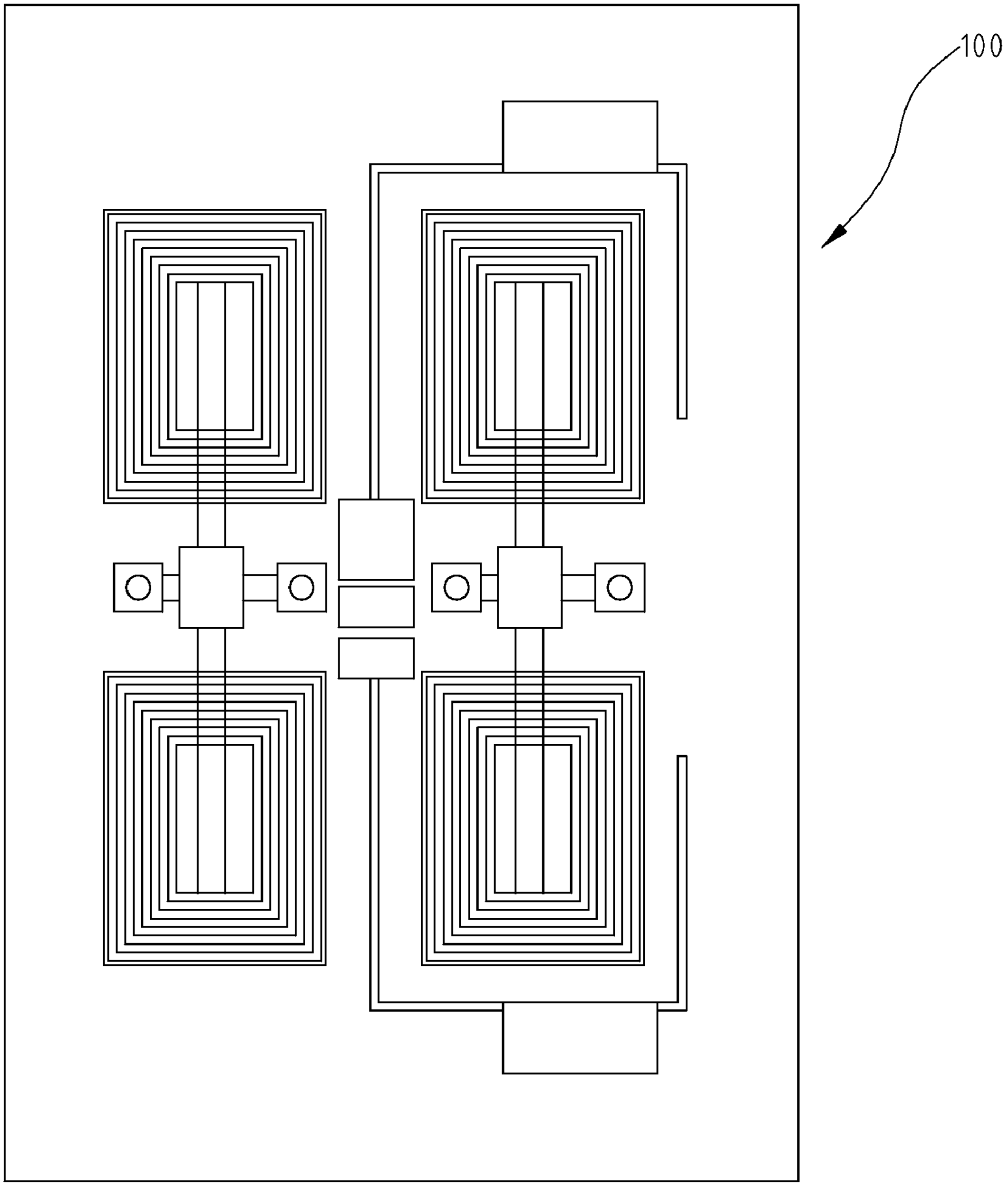
FIG. 1 (PRIOR ART)
FIG. 1 shows a schematic diagram of a conventional balun using lumped elements.
Figure 2A:
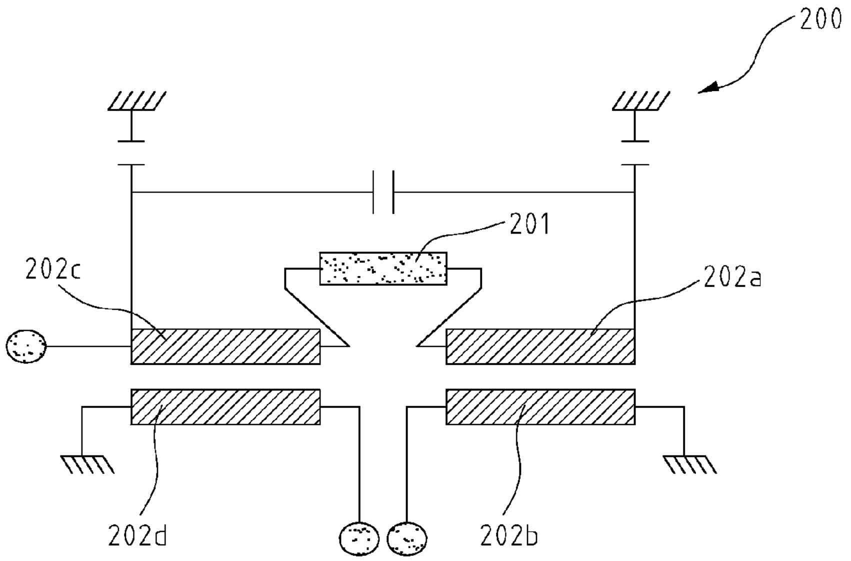
FIG. 2A (PRIOR ART)
FIGS. 2A–2C show three kinds of conventional multi-layer baluns.
Figure 2B:
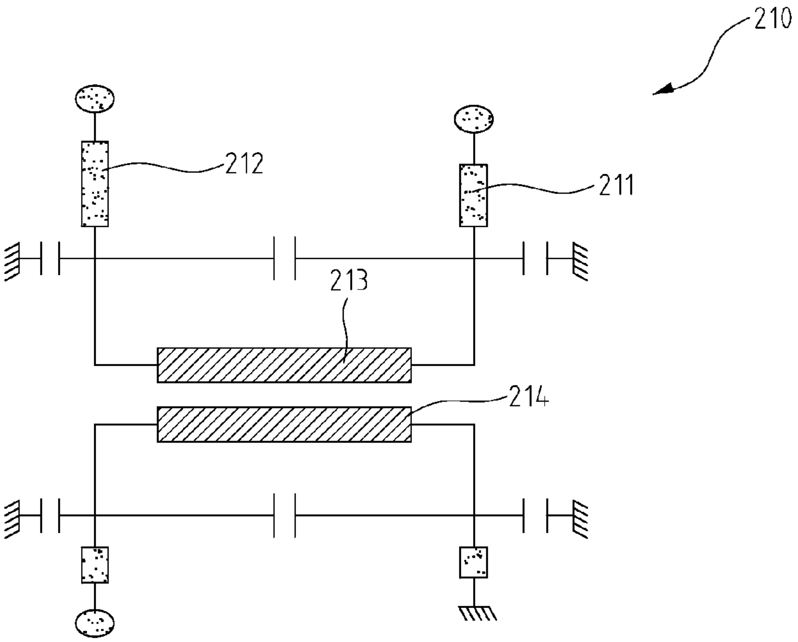
FIG. 2B (PRIOR ART)
Figure 2C:
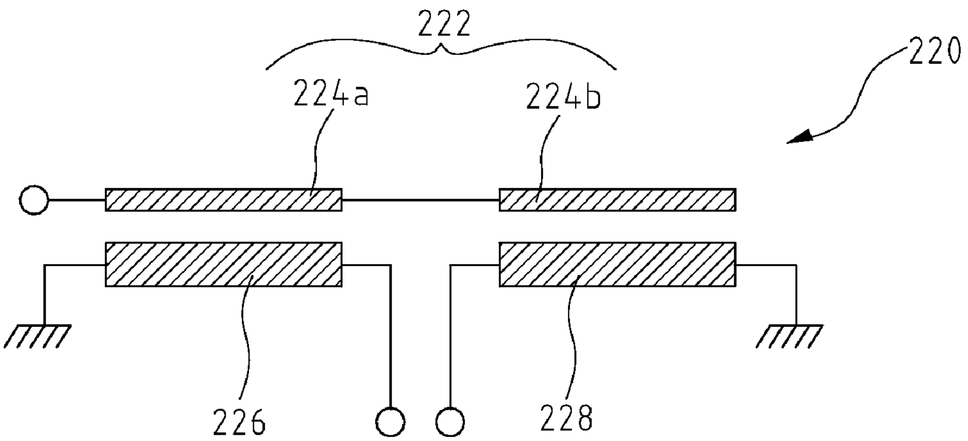
FIG. 2C (PRIOR ART)
Figure 3A:
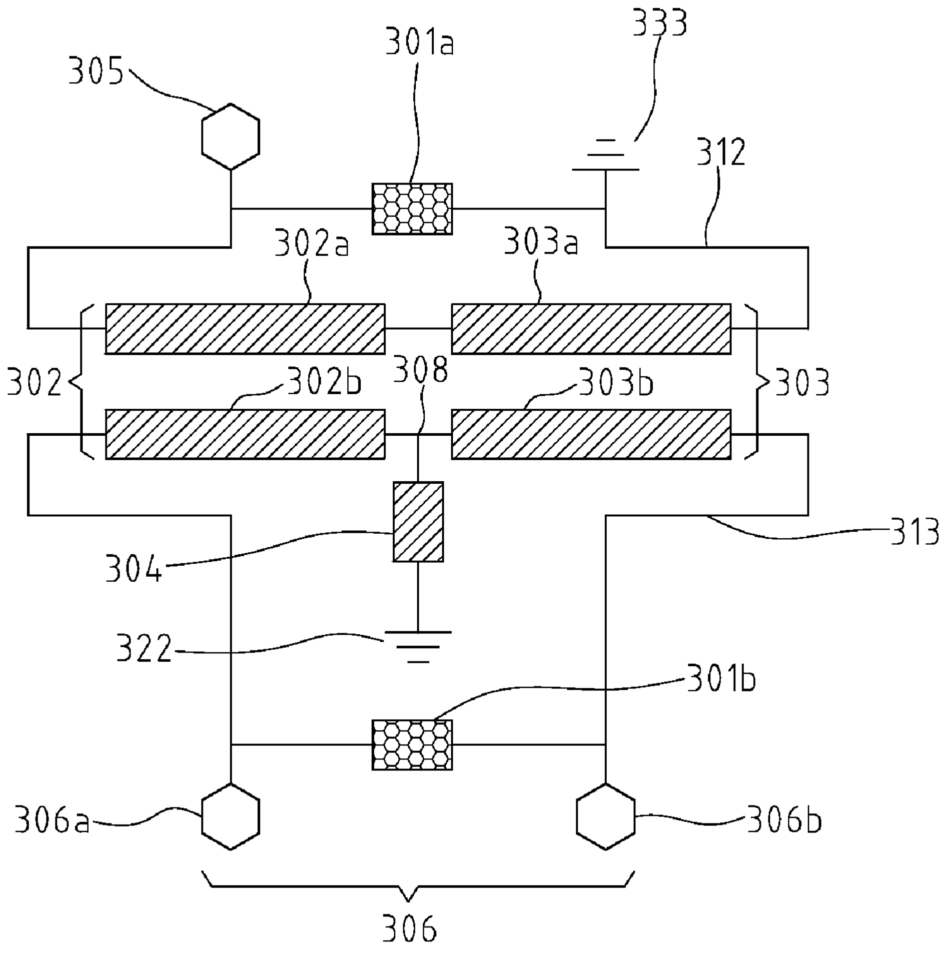
FIG. 3A shows an equivalent circuit of the balun according to the present invention.

FIG. 3A shows the equivalent circuit 300 of a preferred embodiment of miniaturized multi-layer balun according to the present invention. The equivalent circuit 300 comprises a pair of capacitive elements 301*a* and 301*b* that are on the sides connecting to the unbalanced and balanced I/O ports respectively, one section of broadside coupled lines 302, another section of broadside coupled lines 303, a pair of transmission lines 312 and 313, and a ground connection 304 that is on the side connecting to two balanced I/O ports 306*a* and 306*b*.

As can be seen in FIG. 3A, each capacitive element has two ends. One end of capacitive element 301*a* is connected to ground 333, and the other end is connected to the unbalanced I/O port 305. Both ends of capacitive element 301*b* are connected to the two balanced I/O ports 306*a*, 306*b* respectively. The section of broadside coupled lines 302 further includes a first coupled line 302*a* and a second coupled line 302*b*. The section of broadside coupled lines 303 further includes a first couple line 303*a* and a second coupled line 303*b*. The first broadside coupled line 302*a* of broadside coupled lines 302 and the first broadside coupled line 303*a* of broadside coupled lines 303 are connected in serial through the transmission lines 312. Similarly, the second broadside coupled line 302*b* of broadside coupled lines 302 and the second broadside coupled line 303*b* of broadside coupled lines 303 are connected in serial through the transmission lines 313. Each transmission line has two ends. One end of the transmission line 312 is connected to the ground 333, and the other end of the first transmission is connected to the unbalanced I/O port 305. Both ends of the second transmission line 313 are connected to the balanced I/O ports 306*a* and 306*b*. The ground connection 304 is on the side connecting to the balanced I/O ports. One end of the ground connection 304 is connected to the connection point 308 between two second coupled lines 302*b* and 303*b*, and the other end is connected to the ground 322.

In practice, the ground connection may be formed by using via holes or the metal pad of the same layer. The couple of capacitive elements may be implemented with capacitors, vertical coupling electrodes, or horizontal coupled lines. The broadside coupled lines in the embodiment may be a symmetric structure with respect to a center. The circuit in this embodiment may also be extended with respect to the center to include multiple sections of broadside coupled lines in parallel as illustrated in FIG. 3B.

Figure 3B:
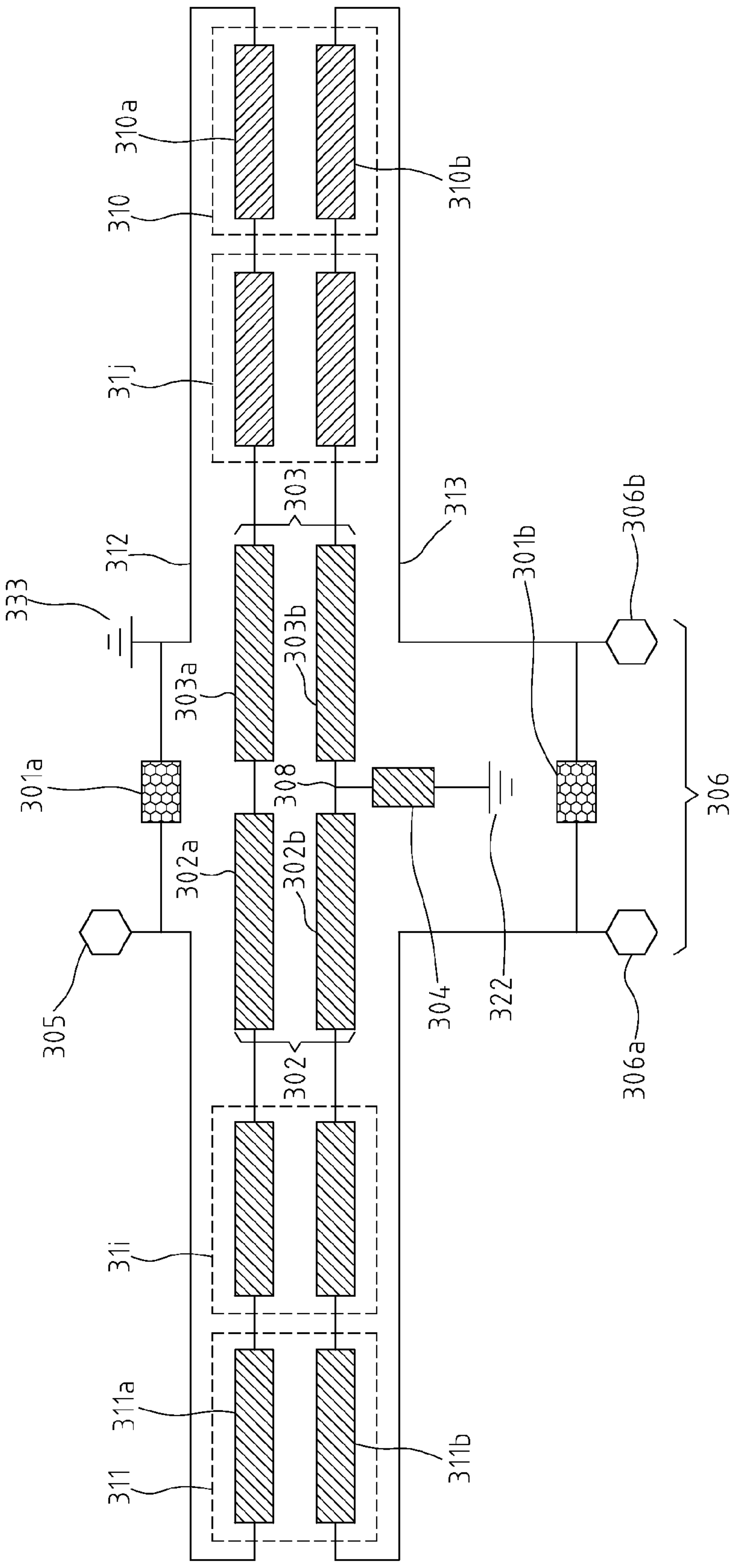
FIG. 3B shows that multiple sections of coupled lines are used to extend the circuit of FIG. 3A.

As can be seen in FIG. 3B, plural of sections of broadside coupled lines are connected to section 302 and section 303 on two sides. Each section of broadside coupled lines comprises first and second couple lines. Each first coupled line of the middle section 31*i* on the left-hand side is connected in series on upper side, and each second coupled line of the middle section 31*i* is connected in series on lower side. The middle section 31*j* on the right-hand side is connected similarly. The most left section 311 has its first coupled line 311*a* connected through the transmission line 312 to the unbalanced I/O port 305, and its second coupled line 311*b* connected through the transmission line 313 to the balanced I/O port 306*a*. The most right section 310 has its first coupled line 310*a* connected through the transmission line 312 to the ground 333, and its second coupled line 310*b* connected through the transmission line 313 to the balanced I/O port 306*b*.

Figure 4:
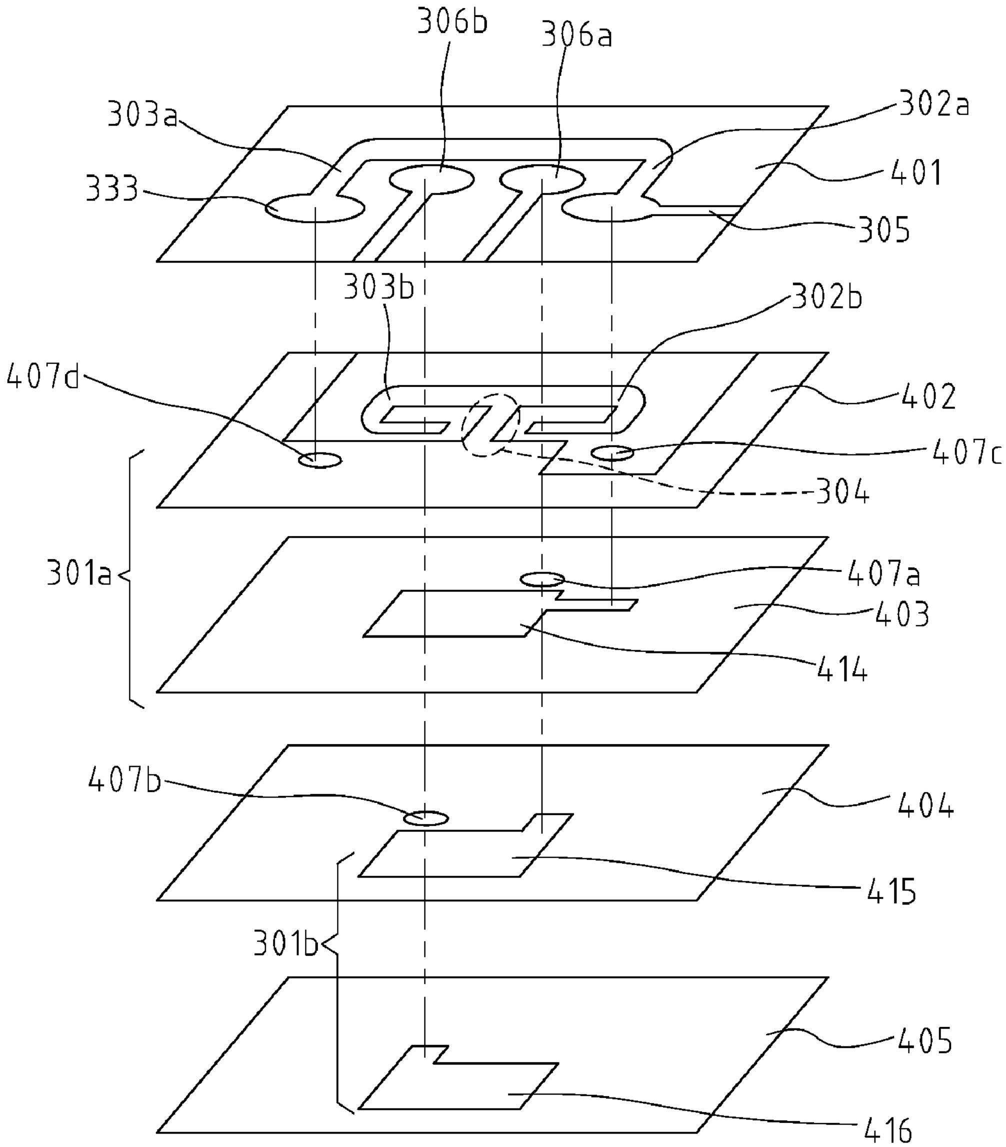
FIG. 4 illustrates a multi-layer device structure of a balun having vertically stacked capacitive elements for the equivalent circuit of FIG. 3A.

As mentioned earlier, by means of the multi-layer structure, the size of the balun is reduced. In addition, the balun can be realized with a smaller number of layers. This will be illustrated in FIG. 4. FIG. 4 illustrates a multi-layer device structure of a balun having vertically stacked capacitive elements for the equivalent circuit of FIG. 3A.

The balun shown in FIG. 4 comprises five conductor layers 401~405 stacked vertically. The unbalanced I/O port 305, ground 333, two balanced I/O ports 306*a* and 306*b*, the first coupled lines 302*a* and 303*a*, and the pair of transmission lines 312 and 313 (not shown) are formed on the main surface of the first dielectric layer 401. The second coupled lines 302*b*, 303*b*, and the ground connection 304 are fabricated on the second conductor layer 402. The third conductor layer 403 realizes an electrode cap 414 of the metal-insulator-metal (MIM) capacitive element 301*a*. As one end of capacitive element 301*a* is connected to the ground 333, only one conductor layer is sufficient to realize the electrode cap required for the capacitive element. In comparison, the fourth and fifth conductor layers 404, 405 realize the electrode caps 415, 416 of the metal-insulator-metal capacitive element 301*b*.

In the multi-layer device structure, plural of via holes are drilled in the conductor layers to provide connections between the electrical elements formed on the conductor layers. For example, a via hole 407*a* in the third conductor layer is provided and forms a connection from the fourth conductor layer 404 through the second conductor layer 402 to the first conductor layer 401, in order to form an electrical connection between capacitive element 301*b*, second coupled line 302*b*, and balanced I/O port 306*a*. A similar via hole 407*b* in the fourth conductor layer is provided and forms a connection from the fifth conductor layer 405 through the second conductor layer 402 to the first metal layer 401, in order to form an electrical connection between capacitive element 301*b*, second coupled line 303*b*, and balanced I/O port 306*b*. Another via hole 407*c* in the second conductor layer is provided and forms a connection from the third conductor layer 403 to the first conductor layer 401, in order to form an electrical connection between capacitive element 301*a,* first coupled line 302*a,* and unbalanced I/O port 305. An additional via hole 407*d* in the second layer is provided to connect all the grounds in the different conductor layers.

Figure 5A:
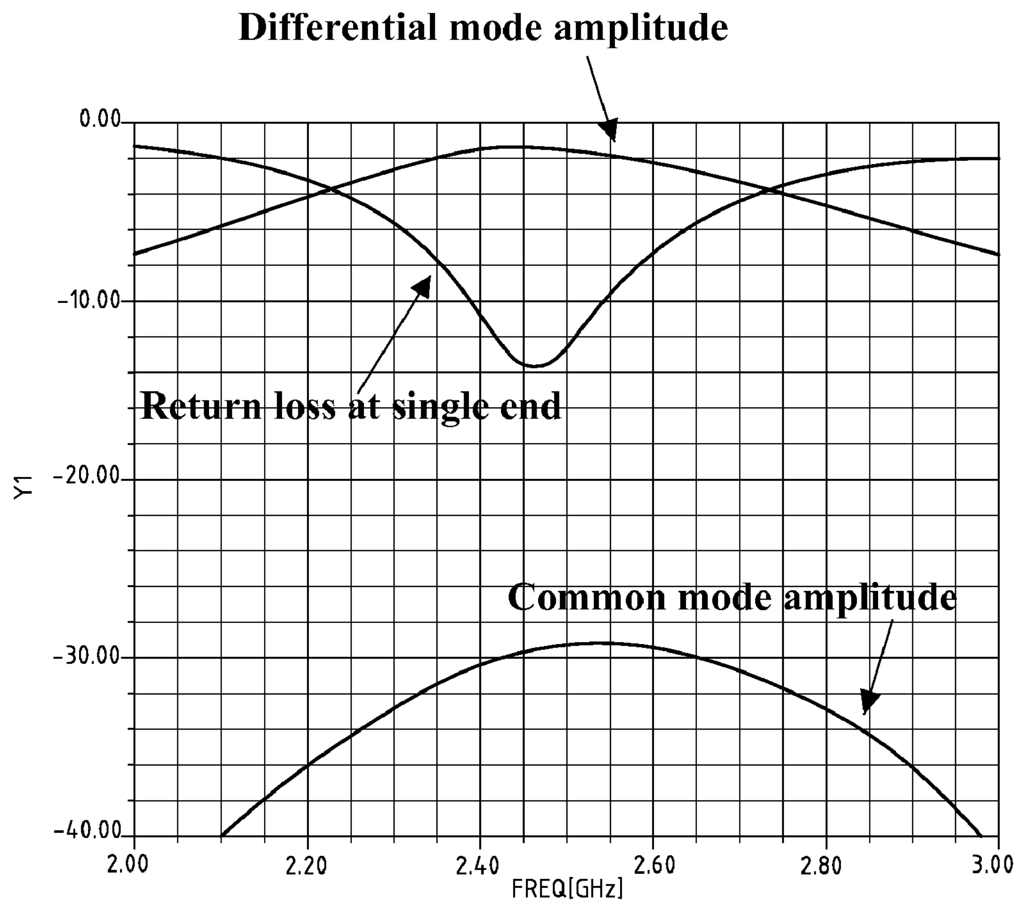
FIG. 5A shows the simulation result on amplitude to frequency response of the balun according to the present invention.

Different capacitance values can be used in the invention to achieve target performance within the operating frequency range for the balun according to the present invention. FIG. 5A shows the simulation result on amplitude to frequency response of the balun according to the present invention. The horizontal axis is the operating frequency of the balun in GHz. The vertical axis shows the return loss at single end and amplitudes of differential mode and common mode in dB, respectively. The return loss at the single end is the reflected impedance from the input signal at the unbalanced input port 305, and the value should be less than −10 dB in the designed frequency range, i.e. 2.34–2.54 GHz. The amplitude value shown as differential mode is the energy of differential mode signals transmitted from the balanced ports to the unbalanced port, and should be at least −2 dB in the operating frequency range. The amplitude value shown as common mode amplitude is the energy of common mode signals transmitted from the balanced ports to the unbalanced port, and should be less than −10 dB in the operating frequency range.

As can be seen from FIG. 5A, the return loss is less than −10 dB. The energy of differential mode signals is pretty higher than −2 dB, and the energy of common mode signals is pretty lower than —10 dB. This indicates that the balance ports receive most of the energy and the energy has been equally distributed, therefore, the balun of the invention has good impedance match.

Figure 5B:
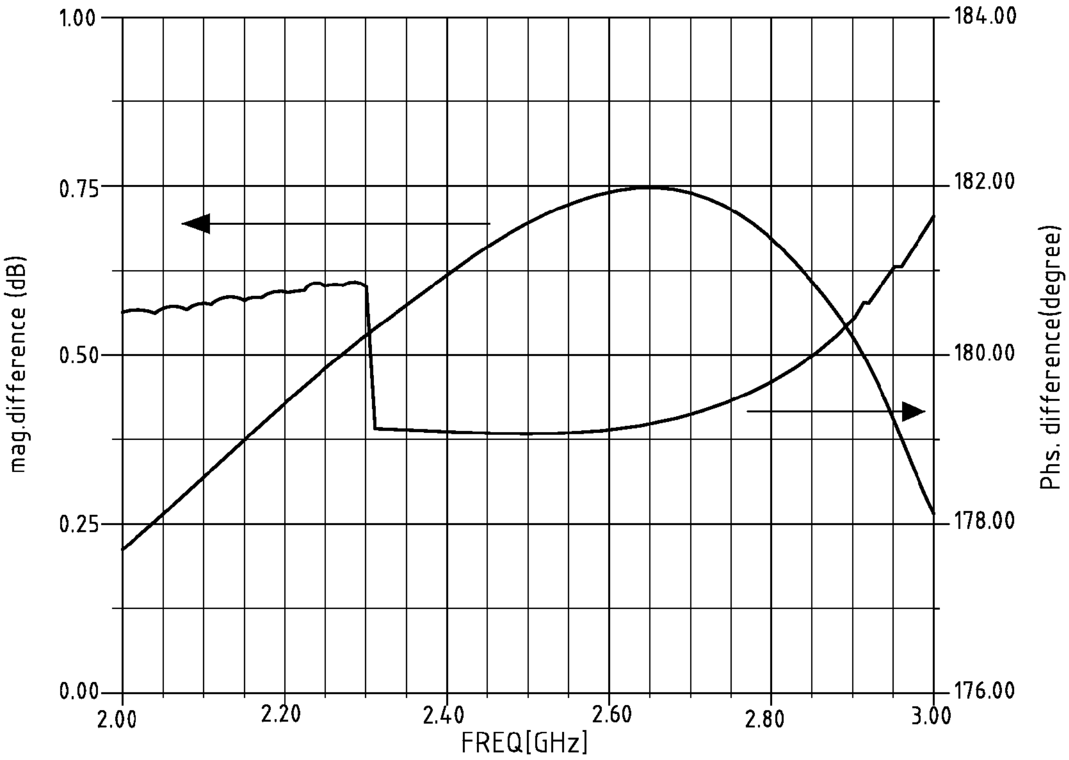
FIG. 5B shows the simulation result on differences in magnitude and phase to frequency response of the balun according to the present invention.

FIG. 5B shows the simulation result on differences in magnitude and phase to frequency response of the balun according to the present invention. The horizontal axis is the operating frequency of the balun in GHz. The vertical axis shows the differences in degree and dB for phase and magnitude respectively. The value shown as magnitude difference is the magnitude difference between the signals transmitted from the unbalanced port to the two balanced ports, and should be less than 2 dB. The value shown as phase difference is the phase difference between the signals transmitted from the unbalanced port to the two balanced ports, and should be kept around 180°±10°. As seen in FIG. 5B, the magnitude difference is between 0.25 dB and 0.75 dB, and the phase difference is between 178° and 182°.

Comparison to the conventional design of a vertically coupling balun which usually requires at least six to eight conductor layers to fabricate, the miniaturized multi-layer balun of the present invention can be fabricated with five conductor layers because of the addition of a ground connection in the coupled lines connected to the ground. This not only greatly decreases the size of the balun device, but also enhances the stability of the device. Thereby, the alignment precision and a higher yield rate can be obtained. In addition, it can be used in a variety of substrates, including dielectric, ceramics, nano-material, and IC, etc. It can be applied in manufacturing IC, Micro-Electro-Mechanical-Systems (MEMS), passive elements, or even nanotechnologies. It is also suitably used in a wireless communication.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A miniaturized multi-layer balun comprising:

an unbalanced port;

first and second balanced ports;

first and second capacitive elements, each capacitive element having first and second ends, the first end of said first capacitive element being connected to said unbalanced port and the second end of said first capacitive element being connected to a ground, both ends of said second capacitive element being connected to the first and second balanced ports respectively;

first and second transmission lines, each having first and second ends, the first end of said first transmission line being connected to said unbalanced port and the second end of said first transmission line being connected to a ground, both ends of said second transmission line being connected to the first and second balanced ports respectively;

at least one section of broadside coupled lines, each section having first and second coupled lines, the first coupled line of each section being connected in series between two ends of said first transmission line, the second coupled line of each section being connected in series between two ends of said second transmission line; and a ground connection having first and second ends, the first end of said ground connection being connected to the second transmission line between two central second coupled lines, and the second end of said ground connection being connected to a ground.

2. The balun as claimed in claim 1, wherein said first capacitive element and said second capacitive element are capacitors.

3. The balun as claimed in claim 1, wherein said first capacitive element and said second capacitive element are vertically coupling electrodes.

4. The balun as claimed in claim 1, wherein said balun is formed by a symmetric multi-layer structure with respect to a center.

5. The balun as claimed in claim 1, wherein said ground connection is connected to a ground through a metal pad or via hole.

6. The balun as claimed in claim 5, said multi-layered structure having at least five vertically stacked conductor layers comprising:

a first conductor layer having a main surface formed wit said unbalanced port, said two balanced ports, the first coupled line of said at least one section of coupled lines, and said two transmission lines;

a second conductor layer having a main surface formed wit the second coupled line of said at least one section of coupled lines, said ground connection, and at least two via holes;

a third conductor layer having a main surface formed with an electrode cap of said first capacitive element, and at least one via hole;

a fourth conductor layer having a main surface formed with a first electrode cap of said second capacitive element and at least one via hole; and a fifth conductor layer having a main surface formed with a second electrode cap of said second capacitive element and at least one via hole.

7. The balun as claimed in claim 6, wherein said via hole on said fourth and fifth conductor layers are used for connecting said first and second electrode caps to said first and second balanced ports, or to said second and first balanced ports, respectively.

8. The balun as claimed in claim 6, wherein the via holes on said second conductor layer are used for connecting the second coupled line of said at least one section of coupled lines to said two balanced ports, and connecting said ground connection to said ground, respectively.

9. The balun as claimed in claim 6, wherein said via hole on said third conductor layer is used for connecting said electrode cap to said unbalanced port.

* * * * *